United States Patent [19]
Ito

[11] Patent Number: 5,481,364
[45] Date of Patent: Jan. 2, 1996

[54] APPARATUS FOR ADAPTIVELY GENERATING A DECODER TABLE FOR VARIABLE-LENGTH CODES USING A STORED CODING TABLE

[75] Inventor: Kenji Ito, Asaka, Japan

[73] Assignee: Fuji Photo Film Co., Ltd., Minami-Ashigara, Japan

[21] Appl. No.: 149,907

[22] Filed: Nov. 10, 1993

[30] Foreign Application Priority Data

Nov. 10, 1992 [JP] Japan .................................... 4-299579

[51] Int. Cl.⁶ .......................... H04N 1/41; H04N 1/419; H03M 1/40; H03M 1/42
[52] U.S. Cl. .................. 358/261.1; 358/427; 358/261.4; 341/65; 341/67; 341/106; 382/233; 382/246
[58] Field of Search ................. 358/426, 261.1, 358/427, 261.2, 430, 261.3, 432, 261.4; 341/65, 67, 106; 382/56, 233, 245, 246; 348/390, 403, 404, 405

[56] References Cited

U.S. PATENT DOCUMENTS 4,612,532  9/1986  Bacon et al. ............................ 341/106
4,862,167  8/1989  Copeland, III ......................... 341/106
5,216,423  6/1993  Mukherjee .............................. 341/106
5,369,502  11/1994  Fukuda et al. .......................... 358/431

FOREIGN PATENT DOCUMENTS 3-220870  9/1991  Japan ................................ H04N 1/41

*Primary Examiner*—Scott A. Rogers

[57] ABSTRACT

An apparatus for expanding variable-length codes includes a decoder responsive to compressed data, into which quantized data is compressed on the basis of coding table data, for expanding the compressed data on the basis of decoding table data for variable-length codes to produce symbol data. The apparatus further includes a storage in which the decoding table data for variable-length codes is rewritably stored and a table schemer for generating the decoding table data, from the coding table data, to store the decoding table data thus generated into the storage. The decoder is adapted to consult with the decoding table data stored in the storage to expand the compressed data. The apparatus may be provided with an encoder responsive to the quantized data for compressing the quantized data on the basis of the coding table data to produce compressed data associated with the quantized data.

9 Claims, 6 Drawing Sheets

| ADDRESSES | CODE LENGTH<br>D19 - D16 | CODES<br>D15 ... D0 |
|---|---|---|
| 00h | 0001 | 00XXXXXXXXXXXXXX |
| 01h | 0010 | 010XXXXXXXXXXXXX |
| 02h | 0010 | 011XXXXXXXXXXXXX |
| 03h | 0010 | 100XXXXXXXXXXXXX |
| 04h | 0010 | 101XXXXXXXXXXXXX |
| 05h | 0010 | 110XXXXXXXXXXXXX |
| 06h | 0011 | 1110XXXXXXXXXXXX |
| 07h | 0100 | 11110XXXXXXXXXXX |
| 08h | 0101 | 111110XXXXXXXXXX |
| 09h | 0110 | 1111110XXXXXXXXX |
| 0Ah | 0111 | 11111110XXXXXXXX |
| 0Bh | 1000 | 111111110XXXXXXX |

Fig. 4

| ADDRESSES | DATA DECODED | | | | | |
|---|---|---|---|---|---|---|
| | D19 | ... | D16 | D15 ... D8 | D7 ... D0 |
| 00h | 1 | 1 | 0 | 0 | 03h | 01h |
| 01h | 1 | 1 | 0 | 1 | 02h | 00h |
| 02h | 1 | 1 | 1 | 1 | 02h | 01h |
| 03h | 1 | 1 | 0 | 0 | 05h | 04h |
| 04h | 1 | 1 | 1 | 1 | 04h | 03h |
| 05h | 1 | 1 | 0 | 1 | 06h | 05h |
| 06h | 1 | 1 | 0 | 1 | 07h | 06h |
| 07h | 1 | 1 | 0 | 1 | 08h | 07h |
| 08h | 1 | 1 | 0 | 1 | 09h | 08h |
| 09h | 1 | 1 | 0 | 1 | 0Ah | 09h |
| 0Ah | 1 | 1 | 0 | 1 | 0Bh | 0Ah |
| 0Bh | 0 | 1 | 0 | 1 | 00h | 0Bh |

APPARATUS FOR ADAPTIVELY GENERATING A DECODER TABLE FOR VARIABLE-LENGTH CODES USING A STORED CODING TABLE

BACKGROUND OF THE INVENTION

1. Field of the Invention

The present invention relates to a compression and expansion apparatus for variable-length codes, more particularly, to an apparatus for compressing image signals into variable-length codes to form compressed data, and an apparatus for expanding compressed codes to restore symbols.

2. Description of the Background Art

In order to store into a memory or transmit imagewise digital data such as picture data resultant from imaging by an electronic digital still camera, for example, various methods of compression coding are established to reduce the amount of data. Especially, the bidimensional orthogonal transform and coding, such as the adaptive cosine transform, is available to accomplish a fairly increased compression ratio or efficiency. The scheme of compressing still image signals on the basis of the adaptive cosine transform is proposed as an international standard of the JPEG (Joint Picture Coding Expert Group) committed Draft.

As one of those standards, the Huffman coding is available. As well known in the art, the Huffman coding is a variable-length coding in which data is encoded so that the average length of codes resultant from the coding becomes shortest. Decoder circuits may be bulky and sophisticated in structure if they are implemented into complete hardware. In order to avoid such bulky and sophisticated structure, look-up tables (LUTs) have conventionally been employed. Such LUTs required very larger storage areas. With some commercially available, large-scale integrated circuits dedicated for the Huffman coding, 32K bit storage areas are required for coding storage whereas even 4M bit storage areas are for decoding. It was difficult to design digital electronic still cameras incorporating such a large-storage capacity memory. In order to overcome those difficulties, Japanese patent laid-open publication No. 220870/1991 proposed a method of automatically producing decoder tables for decoding variable-length codes in which the tree structure is used which defines transition conditions and terminating processings on a bit-by-bit basis of Huffman codes.

For example, electronic digital still cameras using a memory card have a difficulty with respect to storage capacity of the storage device in the camera in order to satisfy the requirements for reducing the size of the cameras. The coding requires the minimum storage capacity of 10K bits pursuant to the JPEG Base Line, for example. It would therefore be advantageous to implement a decoding system with the minimum storage capacity merely required for the Huffman coding.

SUMMARY OF THE INVENTION

It is therefore an object of the present invention to provide a compression and expansion apparatus for variable-length codes capable of decoding variable-length codes with a storage device of smaller storage capacity.

In accordance with the present invention, an apparatus for expanding variable-length codes includes a decoder responsive to compressed data, which is quantized data is compressed on the basis of coding table data, for expanding the compressed data on the basis of decoding table data for variable-length codes to produce symbol data. The apparatus further includes a storage memory in which the decoding table data for variable-length codes is rewritably stored, and a table scheming device for generating the decoding table data from the coding table data and for storing the decoding table data thus generated into the storage memory. The decoder is adapted to access the decoding table data stored in the storage memory to expand the compressed data.

The apparatus may be provided with an encoder responsive to the quantized data for compressing the quantized data on the basis of the coding table data to produce compressed data associated with the quantized data.

The table scheming device may be adapted to produce a histogram depending upon a nature of the quantized data.

In accordance with the invention, the table scheming device generates decoding table data from coding table data to store it into the storage memory. The decoder accesses, in response to the compressed data received, the decoding table data in the storage memory on the basis of the compressed data to expand the compressed data to produce symbol data.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The objects and features of the present invention will become more apparent from consideration of the following detailed description taken in conjunction with the accompanying drawings, which are given by way of illustration only and thus are not limitative of the present invention, and in which:

FIG. 3 shows an example of part of data included in the Huffman coding table used in the embodiment;

FIG. 4 also shows an example of part of data included in the Huffman decoding table used in the embodiment.

DESCRIPTION OF THE PREFERRED EMBODIMENTS

Figure 1:
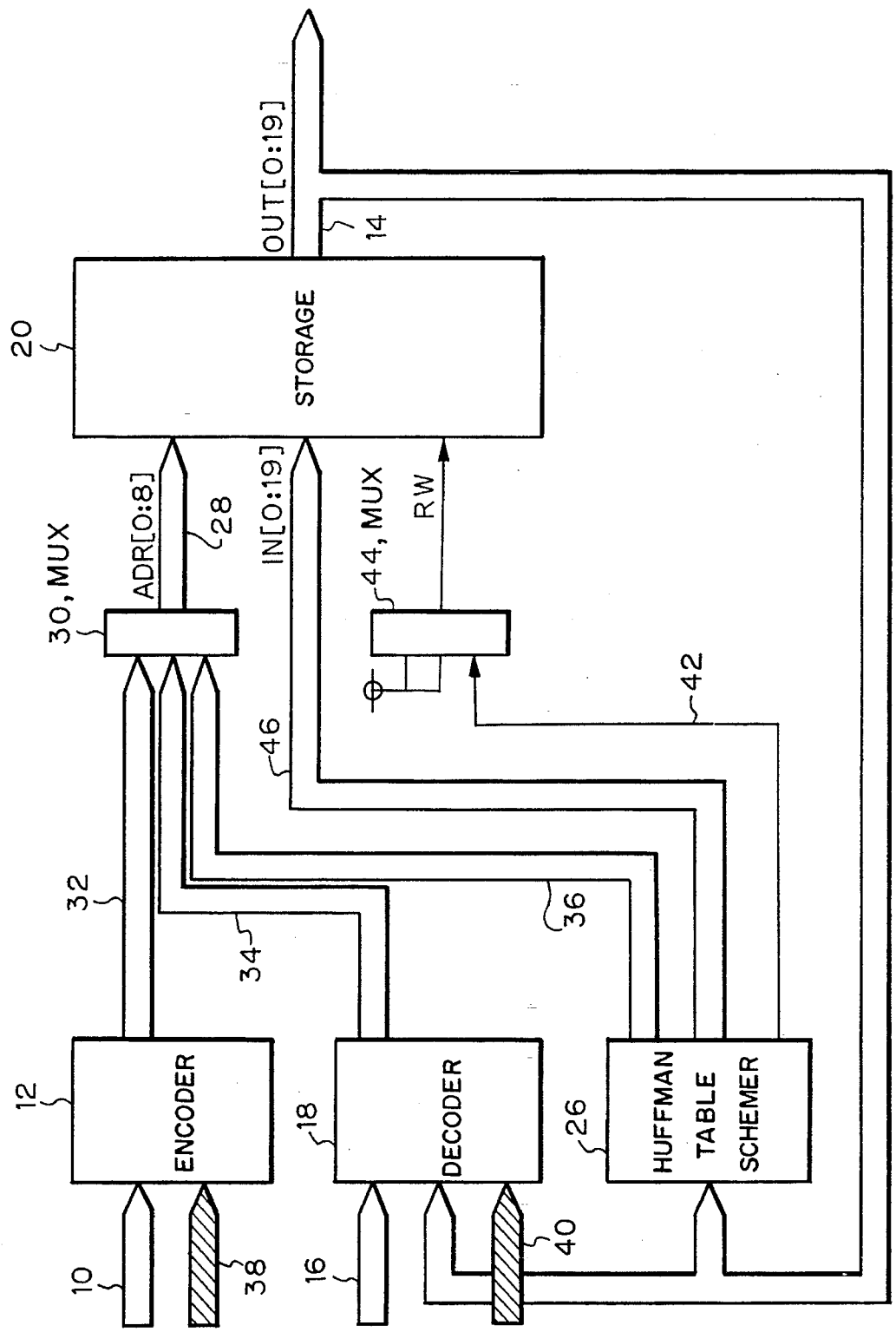
FIG. 1 is a schematic block diagram showing a preferred embodiment of a compression and expansion apparatus of variable-length codes in accordance with the present invention.
Figure 2:
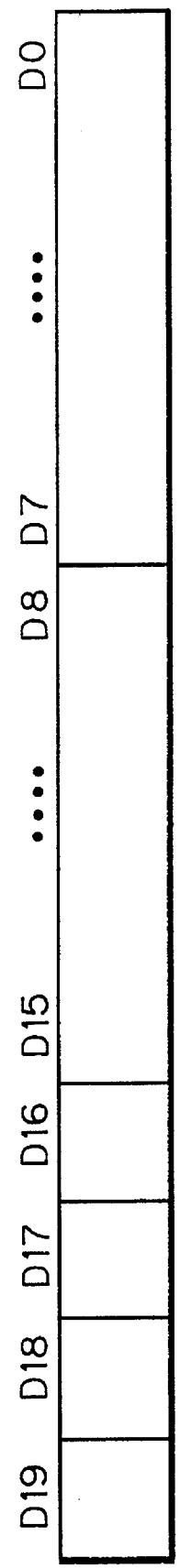
FIG. 2 shows an exemplified structure of the Huffman encoded word used in the preferred embodiment shown in FIG. 1.

With reference to FIG. 1, a preferred embodiment of a compression and expansion apparatus of variable-length codes in accordance with the present invention includes an encoder 12 for compressing quantized data, such as image data, received on one input port of the apparatus 10 into variable-length codes, and a decoder 18 for expanding compressed data such as variable-length codes of image data received on another input port 16 of the apparatus to restore original data or symbols. The illustrative embodiment employs the Huffman coding as the variable-length coding.

The present invention is however not restricted only to the Huffman coding used in the embodiment. The compression coding and expansion decoding are accomplished in the embodiment by using working areas of a storage 20 with reference to a Huffman coding table 22, FIG. 3, and a Huffman decoding table 24, FIG. 4, produced in the form of look-up tables (LUTs) in storage 20. It should be noted that tables 22 and 24 shown in FIGS. 3 and 4, respectively, are mere examples for the explanation purpose with only necessary portions thereof shown and described. The remaining portions which are not necessary for understanding the invention are omitted for simplicity. Data representative of the Huffman coding and decoding tables 22 and 24 is produced by a Huffman table schemer 26 in the embodiment.

Storage 20 is a random access memory (RAM) device provided with a rewritable storage area of at least 10K bit storage capacity for the purpose of storing data of Huffman coding and decoding tables 22 and 24. In addition, storage 20 also includes a work area in which temporarily stored is data used for code-compressing and expanding processings and another area in which program sequences are stored. In the illustrative embodiment, for the area in which the Huffman table data is stored, storage 20 is provided with a couple of memory planes, each of which includes storage locations each corresponding to 256 addresses and including a word of 20 bits, in order to store the amount of data representing encoding tables required for encoding in accordance with the JPEG Base Line. Storage 20 has an addressing port 28 of eight bits, which port is supplied with an address which is addressable of any of the storage locations thereof. Addressing port 28 is interconnected via a multiplexer (MUX) 30 to address output ports 32, 34 and 36 of encoder 12, decoder 18 and Huffman table schemer 26, respectively.

Encoder 12 has, in addition to port 10 which is supplied with quantized data, another input port 38 which is adapted to receive control signals. Encoder 12 functions as addressing a storage location associated with quantized data in Huffman coding table 22 stored in storage 20 to cause a Huffman code to be developed from storage 20 on an output port 14, thereby accomplishing compression coding. Control on read and write RW of storage 20 is established through control connections 42 and a multiplexer 44. In addition, bits of data D0–D19 are transferred over connections 46 tp storage 20. Output port 14 is also interconnected to decoder 18.

Decoder 18 functions to access a Huffman decoding table 24 stored in storage 20 associated with compressed data. Huffman-encoded and received on input port 16 and obtain the stored data from its output port 14 to identify the termination of the decoding tree, and to produce stored data as resultant symbols from output port 14 of storage 20, thereby accomplishing expansion decoding. The decoding operations are controlled in response to control signals provided on a control port 40.

The instant apparatus has also a function of producing Huffman encoding tables 22 on the basis of quantized data received from a host, not shown, by input port 10, as well as decoding tables 24 on the basis of DHT (Defined Huffman Table) parameters available from the host and/or memory 20. The function is implemented by Huffman table schemer or generator circuit 26. Huffman table schemer circuit also serves to utilize the coding table forming function to plot histograms of quantized data in question. In the histograms, occurrences of the quantized data in question are classified in respect to the length of code, and sorted in accordance with addresses corresponding to the length of code. Those addresses represent symbols. The histograms are inherently established dependent upon the nature, particularly statistical characteristics, of data in question, such as imagewise data. That use of the histograms therefore results in producing the most appropriate Huffman coding tables. Detailed description of how Huffman table schemer 26 generates histograms and Huffman coding tables 22 is omitted since it is not directly necessary for understanding the invention.

The address for addressing storage 20 includes nine bits, the most significant bit (MSB) of which represents or identifies the number of a Huffman table 22. As shown in the hexadecimal form (h) in the leftmost column in FIG. 3, the upper four of the eight bits following the MSB are representative of the category of a non-zero value, and the lower four bits thereof are of the run length of zeros. That is reverse to the representations of the JPEG Base Line. The end of block (EOB) is assigned to the address "X00h", and the run length of zeros (ZRL) to the address "X0Fh". Additionally, a.c. values are assigned to addresses "X00h" through "X9Fh" while d.c. values to addresses "XE0h" through "XE8h".

Huffman coding tables 22 are, as exemplarily shown partially in FIG. 3, include data indicative of code lengths and codes in address locations of storage 20. For simplicity, the remaining addressable locations are omitted from the figure. In practice, however, the embodiment includes storage locations up to 256 addresses. Those addresses are the same as those of the histograms, and the data format of one word includes 20 bits as shown in the figure. The upper four bits represent the length of a Huffman code and the lower 16 bits represent a Huffman code. The Huffman coding is a variable-length coding system, and in the specific structure ones of those 16 bits corresponding to the code length data toward the MSB are effective. For example, when the symbol value "02h" is applied to input port 10, binary values "0010" and "011XXXXXXXXXXXXX" are developed from the location of address "02h" in storage 20 as the data of code length and the code, respectively. The letter "X" denotes a don't care bit. The Huffman code produced will be "011".

Decoder 18 in the embodiment uses the tree structure which defines the transition conditions and terminating processings in the Huffman coding on a bit-by-bit basis. An example of the tree-structured decoding table is partially shown in FIG. 4. The illustrative embodiment also includes 256 addresses for storage locations of decoder tables 24. Decoder tables 24 are implemented by developing the transition conditions on a bit-by-bit basis and the terminating processings for producing symbols on the memory areas in storage 20. Data stored in each of the storage locations of storage 20 includes one word of 20 bits, of which the upper four bits D16–D19 form a flag to be used for terminating processings while the lower 16 bits D0–D15 are representative of a transfer address or a symbol. Of the transfer address, the upper eight bits D8–D15 represent an address in storage 20 or a symbol, to which address transfer is made in response to the Huffman value "1" supplied, while the lower eight bits D0–D7 represent an address in storage 20 or a symbol to which address transfer is made in response to the Huffman value "0" supplied.

More specifically, it is defined by terminator flags D16 and D17 whether the lower 16 bits represent an address or a symbol. One, D16, of the terminator flags, which is directed to data D0–D7, defines the flag values "0" and "1" representing that data D0–D7 is an address and a symbol, respectively. The other terminator flag D17, which is directed to data D8–D15, defines the flag values "0" and "1" representing that data D8–D15 is an address and a symbol, respectively. The remaining flags D18 and D19 are write end flags representing whether or not the writing of data D0–D7 and D8–D15 is finished, respectively. The values "1" and "0" denote the writing is completed and not completed, respectively. The write end flags D18 and D19 are used when Huffman table schemer 26 generates Huffman decoding tables 24 from the DHT parameters, and not when decoder 18 decodes.

For example, when the Huffman code "011 . . ." exemplified above is received by input port 16 to decoder 18, decoder 18 will pick up sequentially the bits of binary value "011 . . ." to reference the addresses of decoder tables 24 in storage 20 from the address "00h" in order. First, the address "00h" for storage 20 is supplied on address bus 34 through multiplexer 30 to storage 20, reading in turn out data D0–D19 stored in the storage location thus addressed from storage 20. Decoder 18 determines, on the basis of the value "0" of the first bit of the Huffman coded data "011", how the terminator flag D16 is which is associated with the lower bits D0–D7 of the data thus read out. With the specific example, since the terminator flag D16 is the null, it is determined that the lower eight bits D0–D7 represent a transfer address "01h", to which the control will be transferred.

Decoder 18 in turn addresses the transfer address location "01h" over address bus 34, and extracts the second bit "1" out of the Huffman code "011 . . . ." In response, data D0–D19 stored in the storage location of the transfer address "01h" is read out to decoder 18, which is in turn responsive to the value "1" of the second bit of the Huffman code to identify the terminator flag D17 associated with the bits D8–D15 of the code data read out. It is therefore determined that the value "0" of the terminator flag D17 in the specific example defines the medium eight bits D8–D15 representing the transfer address "02h".

In a similar way, decoder 18 in turn references the transfer address "02h", and extracts the third bit "1 "out of the Huffman code "011 . . . " In response, decoder 18 reads out the data D0–D19 stored in the storage location of the transfer address "02h", and identifies in response to the value "1 "of the third bit of the Huffman code the terminator flag D17, which is associated with the middle bits D8–D15 of the code data read out. It is therefore determined that the value "1 "of the terminatior flag D17 in the example defines the medium eight bits D8–D15 representing the symbol value "02h". The latter value "02_h" will then be developed on output port 14 form storage 20 as the result from the expansion. The developed data is of a symbol value indicative of the Huffman code "011".

In the illustrative embodiment, a Huffman decoder table 24 is uniquely generated by Huffman table schemer 26 for a specific Huffman encoder table 22 stored in storage 20. Alternatively, the system may be adapted to cause a host, not shown, to provide table schemer 26 with DHT parameters to generate Huffman decoder tables 24. Histograms are produced in respect of quantized data having specific characteristics, and Huffman coding tables 22 are generated. Huffman table schemer 26 plots a Huffman decoder table inherent to a specific Huffman encoder table 22.

Figure 5:
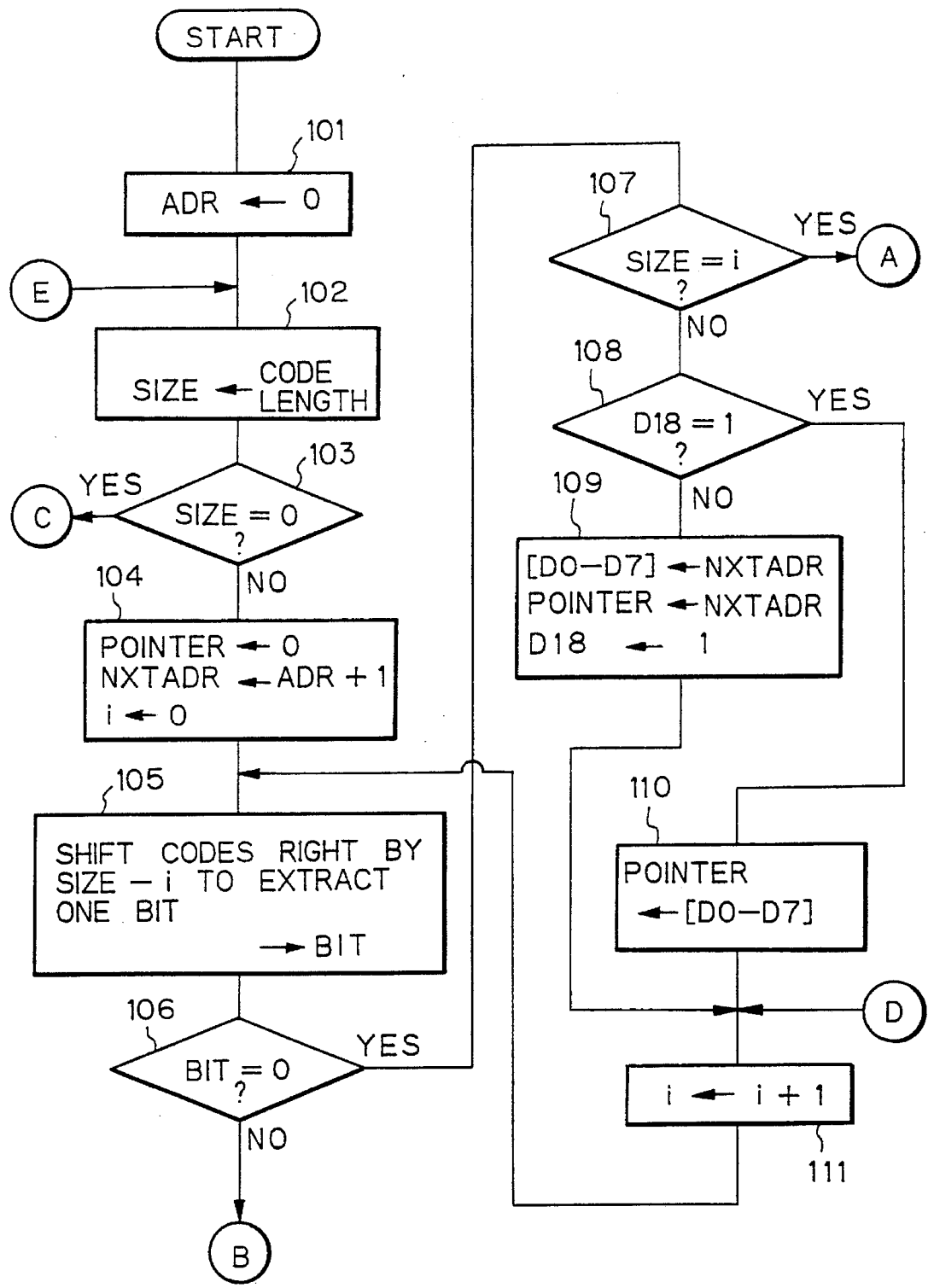
FIGS. 5 and 6 are a flow chart, when combined, showing an example of operations of producing a Huffman decoding table in the embodiment.
Figure 6:
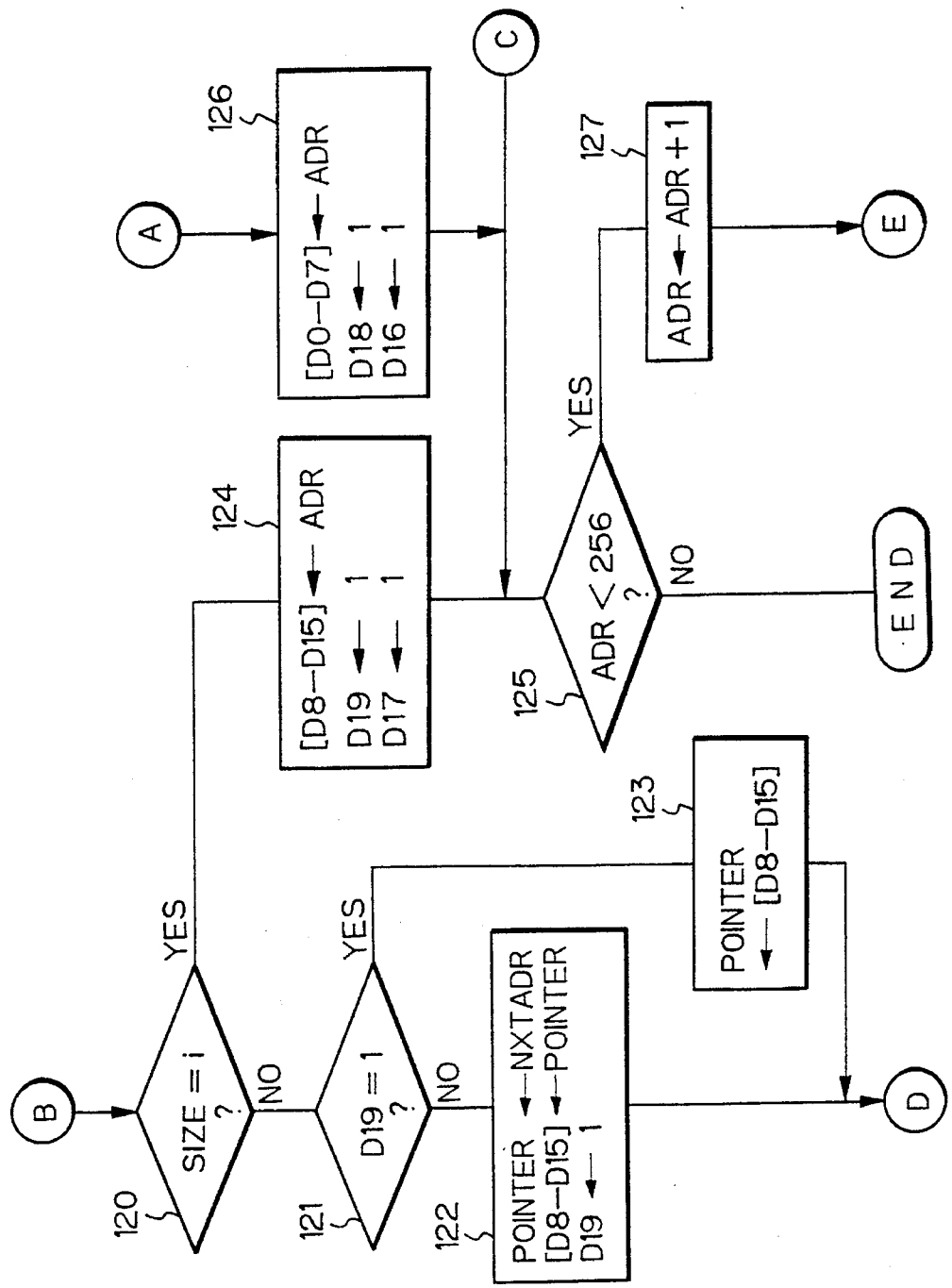

With reference to FIG. 5, Huffman table schemer 26 first initializes the read address ADR in storage 20 to zero in step 101. Storage 20 is then set into its read mode over control connections 42, and the Huffman code at address "00h" will be read out in the form of binary value, 000100XXXXXXXXXXXXXX. The data "0001" representing the code length of the Huffman code will also be stored in a code length register SIZE. The code length register is formed in the work area of storage 20. In this example, the value loaded in the code length SIZE is not null (step 103), and the control is therefore advanced to step 104, in which both a write address pointer POINTER and a digit pointer i are initialized into "0". Additionally, a next address pointer NXTADR is loaded with a value equal to the value included in the write address pointer POINTER plus "one". The write address pointer POINTER, digit pointer i and next address pointer NXTADR are also defined in the work area in memory 20. When the value held in the register SIZE is "0" in step 103, the control moves along the connection marks C in the figures to step 125, FIG. 6, in which a read address pointer ADR for coding table 22 will be incremented.

Table schemer 26 extracts the leftmost, one bit "0" in this example, out of the binary value "00" of the Huffman code portion read out from storage location "00h", the extracted bit being stored in a register BIT (step 105). In step 106, the one bit is extracted generally by shifting that code portion right by the number of bit positions equal to the value (SIZE-i). In this example, since the value BIT is equal to "0" (step 106), and the value SIZE to "1", which is a different from the current value "0" of the bit pointer i (step 107), the control transfers to step 108. In step 108, the write flag D18 associated with data bits D0–D7 stored in the address location "00h" in decoder table 24 still represents "0", and therefore the control shifts to step 109, in which the value "01h" of the next pointer NXTADR will be written into the data bit positions D0–D7 in the address location "00h" in decoding table 24. The write flag D18 associated with data bits D0–D7 will be set to "1" representing a "written state". The resultant, decoded data "0001" "00h" and "01h" thus set up will be developed on data bus 46 to storage 20 while from address bus 36 developed will be the address "00h" in decoding table 24 which is pointed by the write address pointer POINTER. The resultant, decoded data "0001" "00h" and "01h" are then written into bit positions D19–D16, D15–D8 and D7–D0 of the address location "00h" in decoding table 24 in storage 20, respectively. Also, the write address pointer POINTER is loaded with the value of the next address pointer NXTADR. Thus, the transfer address "01h" has been recorded in data bit positions D0–D7 in address location "00h" in decoding table 24.

Control is then transferred to step 111, in which the pointer i is incremented and control returns to step 105. In step 105, as described before, table schemer 26 picks up the second bite "0" out of the binary value "00" of the Huffman code portion read out from address location "00h" currently designated by the read address pointer POINTER, the extracted bit being in turn stored in the register BIT. In the current state, the value BIT is equal to "0" (step 106), and the value SIZE to "1", which is identical to the current value "1" of the bit pointer i (step 107), the control transfers to step 126, FIG. 6, along the connection marks A. In step 126, the terminating processings are performed. In this example, in the storage location memory 20 pointed by the current state of the write address pointer POINTER, or of address "01h". the contents, "00h" in this example of the read address pointer ADR are written into the data portion D0–D7 associated with the second bit "0" of the current Huffman code portion. The contents "00h" of the read address pointer ADR are the symbol to be restored indeed. The terminating processings include defining the terminals of the tree structure which defines the transition conditions on a bit-by-bit basis. In step 126, then, the write flag D18 associated with data bits D0–D7 is set to the indication "1" of the written state, and the terminating flag D16 to the indication of termination "1". The resultant, decoded data "0101" "00h" and "01h" are then written into bit positions D19–D16, D15–D8 and D7–D0 of the address location "01h" in decoding table 24 in storage 20, respectively, in a similar way as discussed above. Thus, the resultant, decoded data in address locations "00" and "01h" has been established in decoding table 24 in memory 20.

Unless the value held in the write address pointer ADR for decoder table 24 in storage 20 reaches "256" (step 125), then control moves to step 127 in which the pointer ADR is incremented with the control returning along connection marks E to step 102, FIG. 5. In a similar way, the following control proceeds in respect of the next storage location "01h" and et seq. in coding table 22 to sequentially produce decoded data in decoding table 24. Out of decoded data "011" in address location "02h" in coding table 22, for example, the leftmost, one bit is extracted, and processings are executed up to step 108 similarly as described above. In step 108, since the write flag D18 associated with data bits D0–D7 in address "00h" in decoder table 24 pointed by the pointer POINTER has already been set to binary "1", control advances to step 110 to load the write address pointer POINTER with the value "01h" of the data bits D0–D7 in the address location "00h" in decoding table 24. Then the control proceeds to step 111, in which the bit pointer i is incremented to go to step 105.

Again, similarly as described above, the second bit "1" is extracted from the binary value "011" of the Huffman code portion in the address location "02h" currently pointed by the read address pointer POINTER to be stored in the bit register BIT. At this time, since the value BIT is binary "1" (step 106), it is stored into the register BIT, and the control will advance to step 120, FIG. 6, along connection marks B. The value of the register SIZE is "2", however, which is not identical with the current "1" of the bit pointer i (step 121) so that step 122 is executed to perform the write processing on memory 20. This is similar to step 126 described above except that the writing processing is made on the contents of the read address pointer ADR, "02h" in this example, to data portion D8–D15 associated with the second bit "1" of the current Huffman code portion in the storage location of address "01h" in storage 20 pointed by the current state of the write address pointer POINTER. The control will then transfer along connection marks D to step 111, FIG. 5.

Then, the control moves through step 111 to step 105, in which, as described above, Huffman table schemer 26 extracts the third bit "1" out of the binary value "011" of the Huffman code portion in the address location "02h" currently pointed by the read address pointer POINTER to store it in the register BIT. Now, since the value BIT is binary "1" (step 106) and the value SIZE is "2", which is coincident with the current value "2" of the bit pointer i (step 120), the terminating process in step 124 will be performed. More specifically, in this example, in the storage location "02h" in memory 20 pointed by the current state of the write address pointer POINTER, the contents, "02h" in this example of the read address pointer ADR are written into the data portion D8–D15 associated with the second bit "1" of the current Huffman code portion. The contents "02h" of the read address pointer ADR are the symbol to be restored indeed. Together with this, the write flag D19 associated with the data bits D8–D15 is set to the indication "1" of the written state, and the terminating flag D17 to the indication of termination "1". The resultant, produced data "1111" "02h" and "01h" are then written into the bit positions D19–D16, D15–D8 and D7–D0 of the address location "02h" in decoding table 24 in storage 20, respectively. Thus, the resultant, decoded date in address location "02h" has been established.

Under those circumstances, operations on the decoded data D8–D15 in the address location "02h" in decoder table 23 for producing another decoded data would cause the control to branch at step 121 to step 123 due to the value "1" of the write flag D19 associated therewith. In step 123, the data D8–D15 is read out to the pointer POINTER as in step 110. Data is generated in the similar way in respect of address locations up to "256" to complete decoding table 24. FIG. 4 shows the state in which decoded data in address location "0Bh" is being generated. Decoder 18 can use decoding table 24, which has thus been generated in storage 20 by Huffman table schemer 26 from encoder table 22, to expand compressed data received on input port 16. This causes the storage areas which are required for developing encoder table 22 in storage 20 to effectively be used to develop decoder table 24 appropriate for original DHT parameters, thus resulting in more effective expansion processings established.

In accordance with the invention, from coding tables of variable-length codes, decoding tables appropriate therefor are developed in a memory. This can therefore accomplish more effective expansion of compressed data, as well as allows a provision in a memory of the minimum storage areas required for developing coding tables to also implement apparatus for expanding variable-length codes which is simplified and effective in structure. Compression and expansion apparatus is also implemented.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What I claim is:

1. An apparatus for expanding variable-length codes comprising:

decoder means for receiving compressed data, which is quantized data compressed on the basis of coding table data, and for expanding the compressed data on the basis of decoding table data for variable-length codes in response to the compressed data to produce symbol data associated with the compressed data;

storage means for rewritably storing therein the decoding table data for variable-length codes; and table scheming means for sequentially generating the decoding table data from the coding table data in accordance with a specified procedure so as to be stored in said storage means, wherein said decoder means accesses the decoding table data stored in said storage means to expand the compressed data.

2. The apparatus in accordance with claim 1, wherein the quantized data includes image data.

3. The apparatus in accordance with claim 2, wherein the variable-length codes are Huffman codes, the coding table data and decoding table data being generated in accordance with Huffman coding.

4. A compression and expansion apparatus for variable-length codes comprising:

encoder means for receiving quantized data and for compressing the quantized data on the basis of coding table data for variable-length codes in response to the quantized data to produce compressed data of variable-length codes associated with the quantized data;

decoder means for receiving the compressed data and for expanding the compressed data on the basis of decoding table data for variable-length codes in response to the compressed data to produce symbol data associated with the compressed data;

storage means for rewritably storing therein the coding table data and the decoding table data for variable-length codes; and table scheming means for sequentially generating the decoding table data from the coding table data in accordance with a specified procedure so as to be stored in said storage means, wherein said decoder means accesses the decoding table data stored in said storage means to expand the compressed data.

5. The apparatus in accordance with claim 4, wherein said table scheming means produces a histogram depending upon a nature of the quantized data.

6. The apparatus in accordance with claim 4, wherein the quantized data includes image data.

7. The apparatus in accordance with claim 6, wherein the variable-length codes are Huffman codes, the coding table data and decoding table data being generated in accordance with Huffman coding.

8. An apparatus for expanding variable-length codes comprising:

a decoder for receiving compressed data, which is quantized data compressed on the basis of coding table data, and for expanding the compressed data on the basis of decoding table data for variable-length codes in response to the compressed data to produce symbol data associated with the compressed data;

a storage device for rewritably storing therein the decoding table data for variable-length codes; and a table schemer for sequentially generating the decoding table data from the coding table data in accordance with a specified procedure so as to be stored in said storage device, wherein said decoder accesses the decoding table data stored in said storage device to expand the compressed data.

9. A compression and expansion apparatus for variable-length codes comprising:

an encoder for receiving quantized data and for compressing the quantized data on the basis of coding table data for variable-length codes in response to the quantized data to produce compressed data of variable-length codes associated with the quantized data;

a decoder for receiving the compressed data and for expanding the compressed data on the basis of decoding table data for variable-length codes in response to the compressed data to produce symbol data associated with the compressed data;

a storage device for rewritably storing therein the coding table data and the decoding table data for variable-length codes; and a table schemer for sequentially generating the decoding table data from the coding table data in accordance with a specified procedure so as to be stored in said storage device, wherein said decoder accesses the decoding table data stored in said storage device to expand the compressed data.

* * * * *